United States Patent [19]

Higgins, Jr. et al.

[11] Patent Number: 5,760,524
[45] Date of Patent: Jun. 2, 1998

[54] SAW DEVICE AND METHOD FOR FORMING SAME

[75] Inventors: Robert J. Higgins, Jr., Plantation, Fla.; Fred S. Hickernell, Phoenix, Ariz.

[73] Assignee: Motorola, Inc., Schaumburg, Ill.

[21] Appl. No.: 707,086

[22] Filed: Sep. 3, 1996

[51] Int. Cl.$^6$ .............................. H01L 41/08; H03H 9/25
[52] U.S. Cl. ................................. 310/313 A; 310/313 R
[58] Field of Search ............................. 310/313 R, 313 A

[56] References Cited

U.S. PATENT DOCUMENTS

| | | | |
|---|---|---|---|
| 3,753,157 | 8/1973 | Ash et al. | 333/7 R |
| 3,760,204 | 9/1973 | Yester | 310/313 R |
| 3,965,444 | 6/1976 | Willingham et al. | 333/30 R |
| 4,484,098 | 11/1984 | Cullen et al. | 310/313 A |
| 4,551,647 | 11/1985 | Day | 310/335 |
| 4,672,254 | 6/1987 | Dolat et al. | 310/313 R |
| 4,879,487 | 11/1989 | Sugai et al. | 310/313 A |
| 5,302,877 | 4/1994 | Sato et al. | 310/313 A |
| 5,446,330 | 8/1995 | Eda et al. | 310/313 R |
| 5,448,126 | 9/1995 | Eda et al. | 310/313 A |
| 5,623,909 | 5/1997 | Allen et al. | 216/41 |

OTHER PUBLICATIONS

Doisy, Martine, "Electroacoustic Characterisation of +64° and +41° Y-Rotated LiNbO$_3$ For Wide Bandwidth Low Loss Filter Design," IEEE 1990 Ultrasonics Symposium, pp. 439–441.

Yamanouchi, Kazuhiko, "Applications for Piezoelectric Leaky Surface Waves," IEEE 1990 Ultrasonics Symposium, pp. 11–13.

Hickernell, F.S. "The Surface Acoustic Wave Propogation Characteristics of 64° Y-X LiNbO$_3$ and 36° Y-X LiTaO$_3$ Substrates with Thin-Film SiO$_2$," IEEE 1995 Ultrasonics Symposium, Washington, Nov. 8, 1995.

*Primary Examiner*—Thomas M. Dougherty
*Attorney, Agent, or Firm*—Andrew S. Fuller

[57] ABSTRACT

A surface acoustic wave (SAW) device (300) is formed from a leaky wave mode piezoelectric substrate (310) to have substantially reduced surface wave attenuation when operating at a particular frequency. The SAW device (300) includes a SAW pattern (322, 324), disposed on a surface (321) of the piezoelectric substrate, having a free surface portion (324) and a shorted surface portion (322). The SAW pattern (322, 324) is overlaid with a material (330), preferably glass, which has a thickness selected to reduce surface wave attenuation.

25 Claims, 3 Drawing Sheets

5,760,524

SAW DEVICE AND METHOD FOR FORMING SAME

TECHNICAL FIELD

This invention relates in general to surface acoustic wave devices, and more particularly, to the manufacture of surface acoustic wave devices.

BACKGROUND

Surface acoustic wave (SAW) devices use acoustic waves propagated on the surface of an elastic solid for electronic signal processing. A typical SAW device uses a transducer, or other SAW geometry, to convert electromagnetic signal waves to acoustic signal waves. The substantial reduction in wave length of acoustic waves, when compared to electromagnetic waves at similar frequencies, allows designers to implement certain complex signal processing functions in a significantly smaller space than would be needed for traditional circuit designs. Thus, a SAW device can offer considerable cost and size advantages over competing technologies. SAW technologies are increasingly found in applications, such as filters, resonators, oscillators, delay lines, and other similar devices.

SAW devices are typically implemented on a piezoelectric substrate, and usually employ a metallized pattern located on the surface of the piezoelectric substrate to generate and detect acoustic waves. The metallized pattern results in a portion of the surface of the piezoelectric substrate having metal, and a portion without metal. The metallized portion is referred to herein as the shorted surface, and the portion without metallization referred to as the free surface. The composition and preparation of the piezoelectric substrate, and the particular metallization pattern used, determine performance characteristics, such as electro-acoustic coupling, surface wave attenuation, insertion loss, and the like, for the SAW device.

Recently, there has been an increased interest in the use of piezoelectric substrates such as lithium niobate, and other such materials having pseudo surface acoustic wave (PSAW) modes for use in surface acoustic wave devices. The PSAW modes, also known as leaky wave modes, are termed as such because some of the surface wave energy associated with the surface acoustic waves is converted to a propagating bulk mode which does not readily decrease in amplitude with increased penetration into the substrate. The bulk mode is readily converted into heat and appears as a propagation loss to the surface wave. Lithium niobate can be prepared to have a PSAW mode by selecting a particular cut angle for the lithium niobate. The PSAW cuts of lithium niobate offer a very high electro-acoustic coupling coefficient which could be useful in applications such as wide bandwidth band pass filters. However, devices fabricated using PSAW substrates are not commonplace because of the high insertion loss typically associated with devices utilizing PSAW modes.

The leaky wave characteristics of lithium niobate and other similar materials have been examined and described in previous publications such as APPLICATIONS FOR PIEZOELECTRIC LEAKY SURFACE WAVES, published at the 1990 IEEE Ultrasonics Symposium, by Kazuhiko Yamanouchi and Masao Takeuchi; and ELECTROACOUSTIC CHARACTERIZATION OF +64° AND +41° Y-ROTATED LiNbO₃ FOR WIDE BANDWIDTH LOW LOSS FILTER DESIGN, published by Doisy et al., at the 1990 IEEE Ultrasonics Symposium. These publications describe characteristics for filters designed with 64° and 41° Y–X lithium niobate. Here, both the high coupling coefficient, and the appreciable attenuation, with respect to filters design using this material, have been noted.

It is desirable to exploit the high coupling coefficient that has been observed for lithium niobate, and other similar materials having a leaky wave mode, to build filters and other SAW devices. Yet, it is desirable to avoid the appreciable surface wave attenuation or insertion loss associated with such devices. Hence, a new approach to the design of SAW devices using piezoelectric substrates having a leaky wave mode is required.

DETAILED DESCRIPTION OF THE PREFERRED EMBODIMENT

Generally, the present invention provides for a surface acoustic wave (SAW) device formed from a leaky wave mode piezoelectric substrate to have substantially reduced surface wave attenuation when operating at a particular frequency. A SAW geometry is disposed on a surface of the piezoelectric substrate and has a free surface portion and a shorted surface portion. The SAW geometry is overlaid with a material, preferably glass, which has a thickness selected to reduce surface wave attenuation of the free surface portion. The piezoelectric substrate preferably comprises lithium niobate, or other leaky wave mode material, having propagation and surface normal directions selected to minimize, or at least substantially reduce, the surface wave attenuation from the shorted surface portion of the SAW geometry. In the preferred embodiment, the thickness, H, of the overlaid material is related to the operating frequency, F, of the SAW device such that the product of H and F ranges from 50 to 1500, where H is expressed in meters, and F is expressed in hertz.

Figure 1:
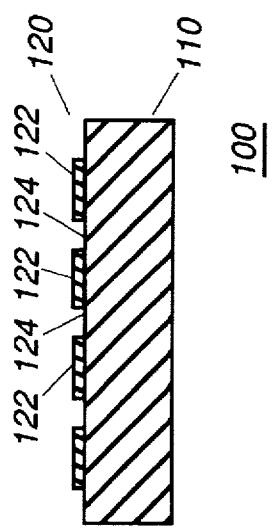
FIG. 1 is a cross-sectional view of a prior art SAW filter using a leaky surface wave piezoelectric substrate, in accordance with the present invention.

FIG. 1 is a cross-sectional view of a prior art SAW filter 100 implemented on a leaky wave mode piezoelectric substrate. The SAW filter 100 includes a piezoelectric substrate layer 110, and a SAW pattern layer 120. The SAW pattern layer 120 includes shorted surface portions 122, generally formed by metallization, and free surface portions 124. The shorted and free surface portions 122, 124 define the SAW geometry which may be, for example, a SAW transducer with interdigitated fingers. The piezoelectric substrate 110 is formed from a leaky wave cut of lithium niobate having specific propagation and surface normal directions. The propagation direction for PSAW modes of lithium niobate is normally expressed as the crystallographic X direction. The surface normal direction is a vector in the crystallographic Y–Z plane. The Y-cut angle is defined as the angle between the crystallographic Y direction and the surface normal direction. SAW propagation in the X direction on a substrate with a Y-cut angle of 64° would normally be abbreviated as 64° Y–X. The combination of the substrate's surface normal direction and the SAW propagation direction, with respect to the crystallographic directions, is collectively referred to as the substrate's orientation.

Figure 2:
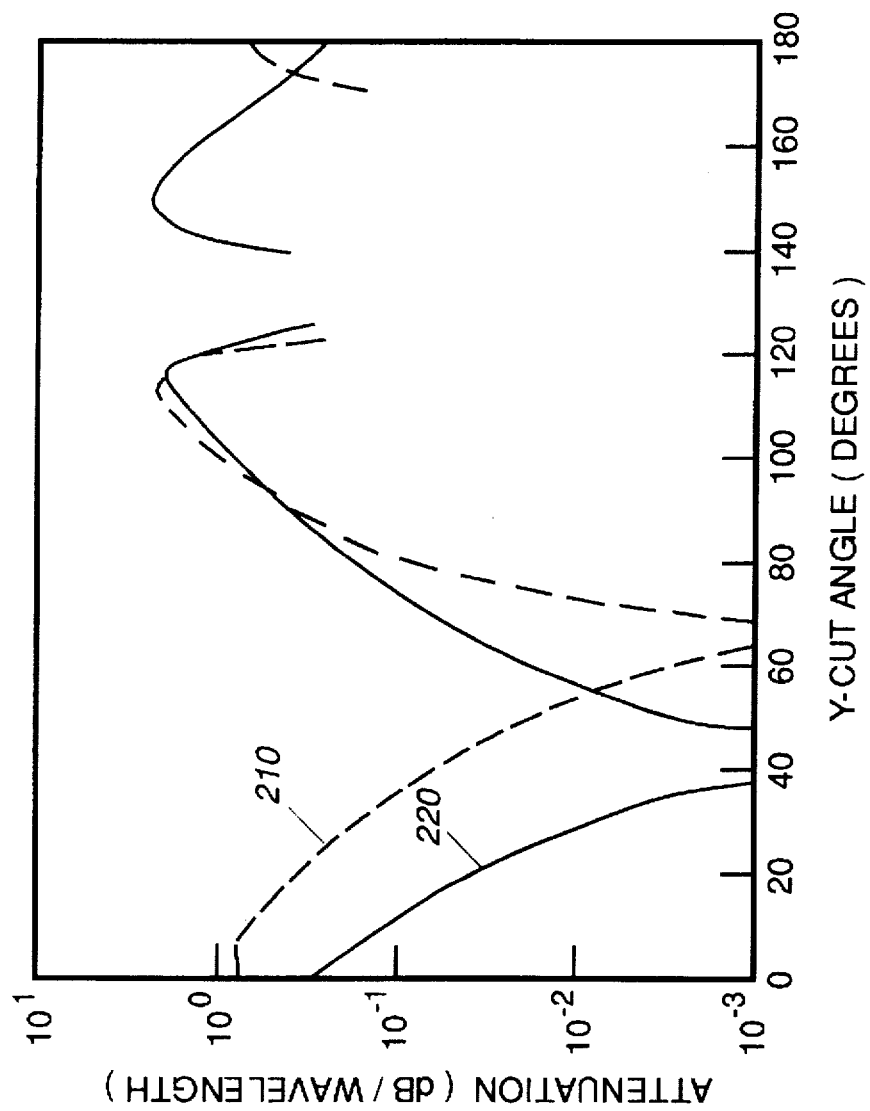
FIG. 2 is a graph showing attenuation versus Y-cut angle for lithium niobate as reported in the prior art.

The substrate 110 is formed from 64° Y–X lithium niobate crystal which supports a leaky wave mode commonly used in the prior art to minimize or reduce attenuation from the metallized portion of the SAW pattern. Prior art devices have alternatively used 41° Y–X lithium niobate in an attempt to minimize attenuation from the free surface of the SAW pattern. Such Y-cuts of lithium niobate are based on previously reported graphs of attenuation versus Y-cut angle. One such prior art graph 200 is shown in FIG. 2. The graph 200 depicts attenuation for both the shorted surface, plot 210, and the free surface, plot 220, of a SAW pattern implemented on lithium niobate having a particular Y-cut angle, also referred to as a rotating angle. The graph shows the attenuation from the free surface minimized with Y–X values at or near 41°, and attenuation from the shorted surface minimized at Y–X values at or near 64°. Accordingly, it is conventional to form SAW devices using 41° or 64° Y–X lithium niobate.

Figure 3:
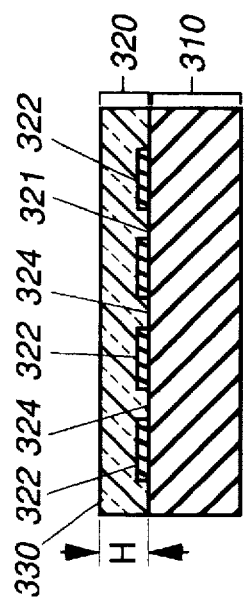
FIG. 3 is a cross-sectional view of a SAW device, in accordance with the present invention.

FIG. 3 shows a cross-sectional view of a SAW device 300, such as a filter, in accordance with the present invention. As in FIG. 1, the SAW device 300 includes a piezoelectric substrate layer 310, and a SAW geometry or pattern layer 320. The SAW pattern layer 320 is disposed upon a surface 321 of the piezoelectric substrate layer 310, such that there are shorted surface portions 322, such as formed by metallization, and free surface portions 324, such as without metallization. According to the present invention, the SAW device 300 is formed to control, so as to reduce, attenuation when the SAW device is operating normally at a particular operating frequency. Attenuation is preferably controlled by overlaying the SAW geometry by glass or other suitable material, and/or by selecting an appropriate Y-cut angle for the leaky wave mode piezoelectric substrate.

In a preferred embodiment, the piezoelectric substrate is formed from 57° Y–X lithium niobate. Here, the Y-cut angle is selected to minimize the attenuation of the shorted surface portion 322. The selection of 57° Y–X lithium niobate highlights one aspect of the present invention. In prior art applications, 64° Y–X lithium niobate was used in an attempt to minimize the attenuation of the shorted surface portion. It has been determined that contrary to the previously reported attenuation characteristic of lithium niobate, the attenuation is minimized at Y-cut values of 57° and 39° for the shorted and free surfaces respectively, rather than at 64° and 41° as previously reported. This determination is based on presently known constants for lithium niobate. Further, according to the present invention, its been determined that a layer of glass, or other suitable material, of a specific thickness results in the overlapping of the minimized regions of attenuation for the shorted and free surface portions of the SAW pattern. Accordingly, the SAW device of the preferred embodiment includes a layer of glass 330 disposed over the SAW pattern 322,324 on the piezoelectric substrate 310. Preferably, the Y-cut angle of the piezoelectric substrate is selected to minimize, or at least substantially reduce, the attenuation of the shorted surface. Simultaneously, the thickness of the layer of glass selected to minimize, or at least reduce, the attenuation of the free surface for a particular operating frequency of the SAW device.

Figure 4:
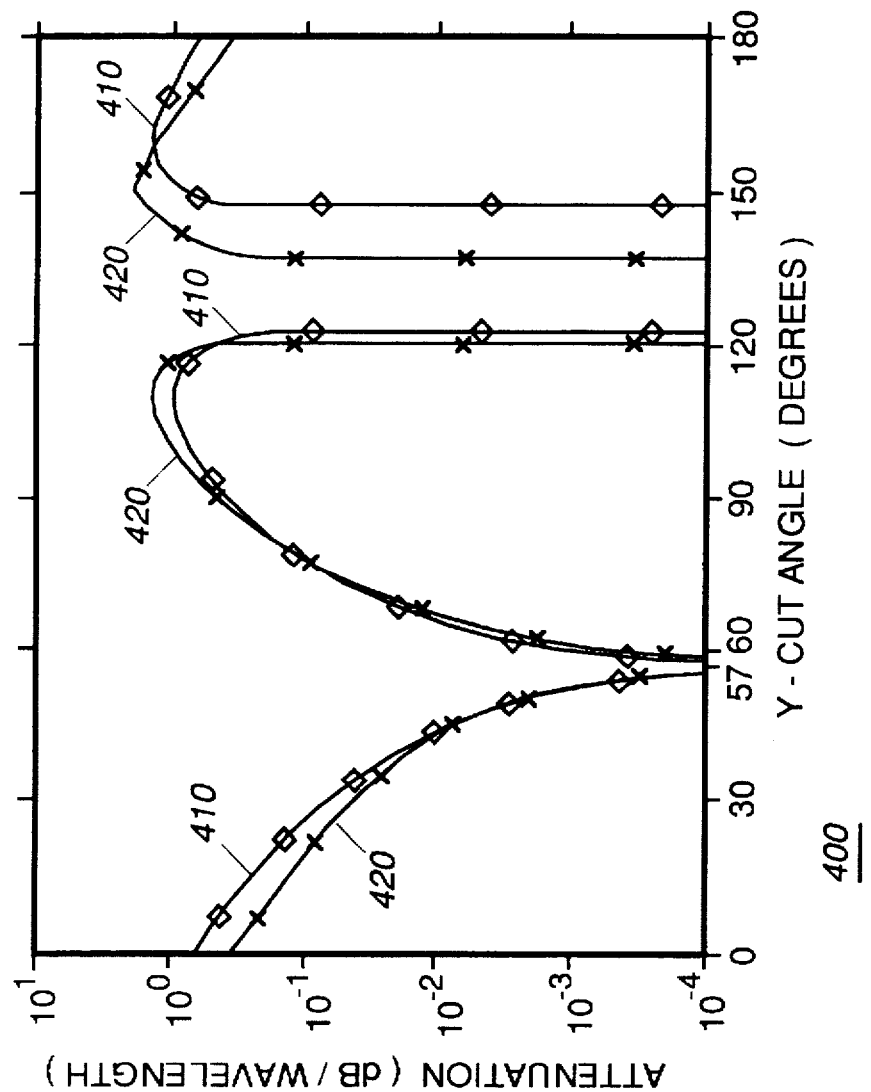
FIG. 4 is a graph showing attenuation versus Y-cut angle for glass coated lithium niobate, in accordance with the present invention.

FIG. 4 has a graph 400 showing attenuation or propagation loss characteristics of a SAW pattern on lithium niobate as a function of the Y-cut angle of the lithium niobate. The SAW pattern has an overlay of fused silica ($SiO_2$) of a thickness of 4000 angstroms (Å). It can be seen that the attenuation for the shorted surface, shown as plot 410, is minimized for a Y–X value of 57°. Similarly, the 4000Å of fused silica causes the attenuation on the free surface, shown as plot 420, to be minimized at or near the 57° value. In other words, both the free surface and shorted surface have attenuation zeroes at or near 57°. Note that substantially improvement in reducing attenuation can be realized for Y-cut angles within (+/−) 3° of the 57° value, i.e., between 54° and 60°. With such a combination, the overall attenuation is substantially reduced when compared to SAW patterns implemented on 41° or 64° cuts of lithium niobate with no glass overlay. A non-exhaustive list of other suitable glass materials include silicon monoxide (SiO) and silicon nitride (SiN).

The thickness of the film of glass required for a given implementation is frequency dependent, and is also dependent on the material characteristics of the glass selected and of the piezoelectric substrate. However, for a given glass material and frequency of operation, the product of the glass thickness, H, times the frequency of operation, F, can be used as design guideline for selecting the appropriate thickness of glass. For example, it has been determined that if the thickness H is selected such that the product of H and F has a value ranging from 50 to 1500, acceptable improvement in attenuation can be achieved, particularly for glass on lithium niobate, where H is expressed in meters, and F in hertz. Thus, the product HF is preferably greater or equal to 50, and when the lithium niobate has a Y-cut angle ranging from 62 to 100, the HF product is preferably less than or equal to 1500; when the lithium niobate has a Y-cut angle ranging from 53 to 61, the HF product is preferably less than or equal to 1000; and when the lithium niobate has a Y-cut angle ranging from 45 to 52, the HF product is preferably less than or equal to 500.

The appropriate thickness of the film of glass can be further expressed in terms of the particular operating frequency desired, and the material coefficients of the glass and the piezoelectric substrate used. It has been determined that the relationship is:

$$H = 1/f_0(a_{00} + a_{11}p + a_{12}p^2 + a_{21}c_{11}^2 + a_{22}c_{11}^2 + a_{31}c_{44} + a_{32}c_{44} + a_{41}\beta + a_{42}\beta^2)$$

where,

H is the glass thickness in meters;

$f_0$ is the operating frequency in hertz;

$\rho$ is the mass density of the glass in $kg/m^3$;

$c_{11}$, $c_{44}$ are glass stiffness tensor elements divided by $10^{10}$ newton-meters;

$\beta$ is the Y-cut angle for the target free surface attenuation zero (degrees), ordinarily selected to be the Y-cut angle of the piezoelectric substrate;

$\alpha_{00}$ is 382.983, $\alpha_{11}$ is −1.09387, $\alpha_{12}$ is 0.143273E−03, $\alpha_{21}$ is 89.1932, $\alpha_{22}$ is −7.75504, $\alpha_{31}$ is 386.210, $\alpha_{32}$ is −12.5911, $\alpha_{41}$ is −2.90886, $\alpha_{42}$ is 0.164125.

The above relationship is particularly useful for lithium niobate. Note that although this equation represents an optimized thickness, a significant reduction in attenuation is likely if the actual thickness is within reasonable range of the optimized thickness. For example, a glass thickness within thirty or fifty percent of the optimize thickness may still yield significant results.

Figure 5:
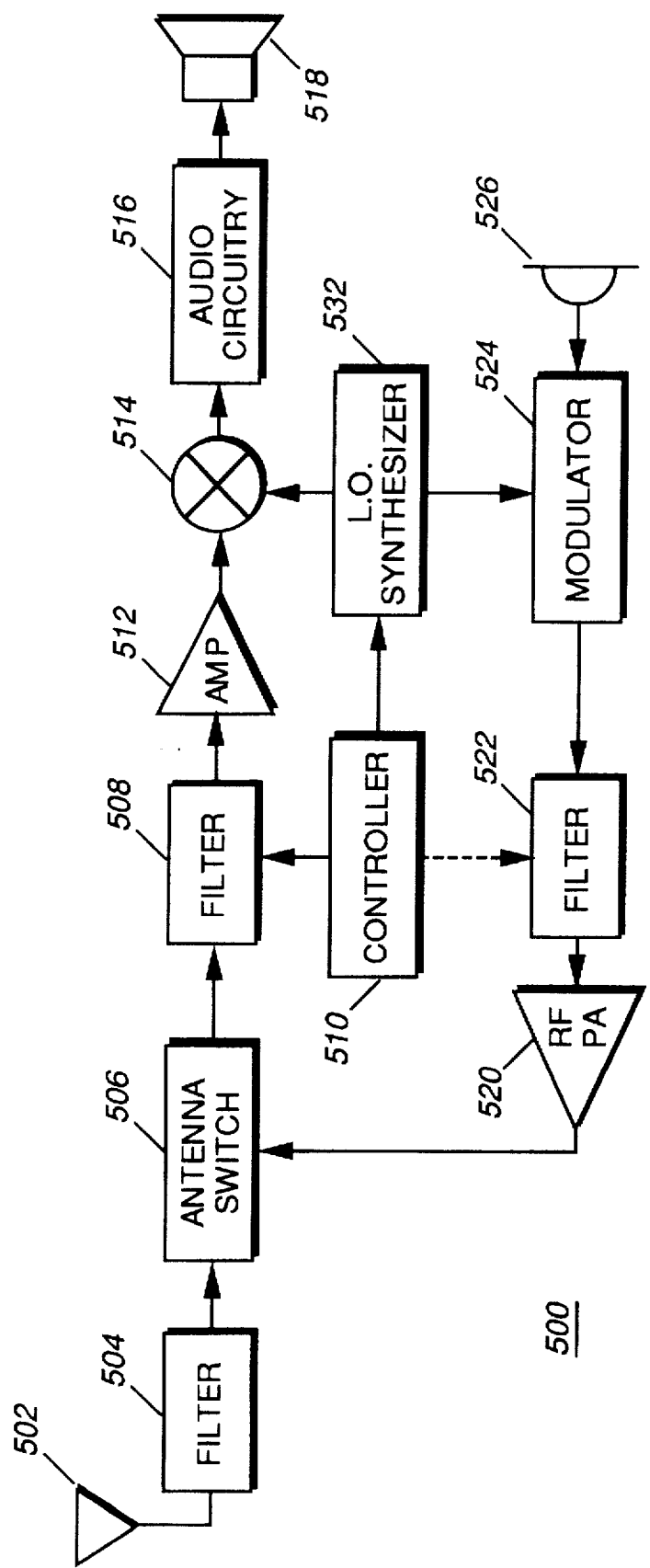
FIG. 5 is a block diagram of radio incorporating a SAW filter, in accordance with the present invention.

Referring to FIG. 5, a block diagram of a radio 500 is shown, in accordance with the present invention. The radio is a portable two-way communication device capable of operating in receive and transmit modes to communicate using radio frequency signals. In receive mode, the radio 500 receives a communication signal via an antenna 502. The received communication signal is coupled to a filter 504, and to an antenna switch 506. A filter 508 provides radio front-end selectivity for the received communication signal. The filter 508 is preferably implemented as a SAW filter, according to the present invention. The output of the filter 508 is applied to an amplifier 512, and to a mixer 514. The mixer 514 receives a local oscillator (LO) injection signal from a synthesizer 532 to produce an intermediate frequency (IF) signal. The IF signal is applied to a well known audio section 516 which, among other things, amplifies audio signals and presents them to a speaker 518. Overall operational control is provided by a controller 510 in a well known manner.

In transmit mode, an audio signal is provided by a microphone 526, and applied to a well known modulator section 524, to provide a modulated signal to a filter 522. The modulator section 524 also receives a local oscillator signal from the synthesizer 532. The filter 522 is preferably implemented according to the present invention. A transmit power amplifier 520 amplifies the output of the filter 522 and applies it to the antenna 502 through the antenna switch 506 for transmission of a communication signal.

The present invention offers significant advantages over the prior art. SAW filters can be manufactured with significantly lower loss than previously contemplated while offering the high coupling coefficient associated with leaky wave mode piezoelectric substrates. By enabling the use of SAW filters in low loss applications, the miniaturization benefits of using SAW filters can be exploited to reduce the size of products.

What is claimed is:

1. A surface acoustic wave (SAW) device operable at a particular frequency, comprising:
    a piezoelectric substrate having a leaky wave mode, and having a SAW pattern thereon; and
    a glass layer overlaying the SAW pattern, the glass layer having a thickness selected to effect a substantial reduction in attenuation when the SAW device is operating at the particular frequency.

2. The surface acoustic wave device of claim 1, wherein:
    the SAW pattern comprises a metallized portion; and
    the piezoelectric substrate comprises a crystal material having an X-propagating Y-cut angle selected to substantially reduce attenuation from the metallized portion.

3. The surface acoustic wave device of claim 2, wherein the piezoelectric substrate comprises a lithium niobate crystal having a Y-cut angle between 54 and 60 degrees.

4. The surface acoustic wave device of claim 2, wherein the piezoelectric substrate comprises a lithium niobate crystal having a Y-cut angle of approximately 57 degrees.

5. The surface acoustic wave device of claim 1, wherein:
    the SAW pattern comprises a free surface portion; and
    the thickness of the glass layer is selected primarily to minimize attenuation from the free surface portion.

6. The surface acoustic wave device of claim 1, wherein:
    the thickness, H, of the glass layer, in meters, is related to the particular frequency, F, in hertz, such that H times F is less than or equal to 1500.

7. The surface acoustic wave device of claim 1, wherein:
    the thickness, H, of the glass layer, in meters, is related to the particular frequency, F, in hertz, such that H times F is greater or equal to 50.

8. The surface acoustic wave device of claim 7, wherein:
    the piezoelectric substrate comprises lithium niobate;
    the thickness, H, of the glass layer, in meters, is related to the particular frequency, F, in hertz, such that H times F is greater or equal to 50; and
    H times F is less than or equal to 1500.

9. The surface acoustic wave device of claim 8, wherein H times F is less than or equal to 1000, when the lithium niobate has an X-propagating Y-cut angle ranging from 53 to 61 degrees.

10. The surface acoustic wave device of claim 8, wherein H times F is less than or equal to 1500, when the lithium niobate has a X-propagating Y-cut angle ranging from 45 to 52 degrees.

11. A surface acoustic wave (SAW) device operable at a particular operating frequency, comprising:
    a piezoelectric substrate having a leaky wave mode, the piezoelectric substrate having a SAW pattern thereon; and
    a layer of material overlaying the SAW pattern, the layer of material having a thickness that substantially reduces attenuation when the SAW device is operating at the particular frequency.

12. The surface acoustic wave device of claim 11, the thickness, H, of the layer of material, in meters, is related to the particular operating frequency, F, in hertz, such that H times F ranges from 50 to 1500.

13. The surface acoustic wave device of claim 11, the thickness, H, of the layer of material, in meters, is related to the particular operating frequency, F, in hertz, such that H times F ranges from 50 to 1000.

14. The surface acoustic wave device of claim 11, the thickness, H, of the layer of material, in meters, is related to the particular operating frequency, F, in hertz, such that H times F ranges from 50 to 500.

15. The surface acoustic wave device of claim 11, wherein:
    the piezoelectric substrate comprises lithium niobate;
    the layer of material comprises glass; and
    the thickness, H, of the layer of material, in meters, is related to the particular operating frequency, F, in hertz, such that H times F is greater or equal to 50.

16. The surface acoustic wave device of claim 11, wherein:
    the piezoelectric substrate comprises lithium niobate;
    the layer of material comprises glass; and
    the thickness, H, of the layer of material, in meters, is related to the particular operating frequency, F, in hertz, such that H times F is less than or equal to 50.

17. A surface acoustic wave (SAW) device operable at a particular operating frequency (F), comprising:
    a piezoelectric substrate having a SAW pattern with a shorted surface portion and a free surface portion, the piezoelectric substrate comprising a leaky wave mode material having a particular X-propagating Y-cut angle selected such that shorted surface has an attenuation at or near zero when the SAW device operates at the particular operating frequency; and a glass material disposed over the SAW pattern, the glass material having a thickness that causes the free surface portion to have an attenuation at or near zero when the SAW device operates at the particular operating frequency.

18. A surface acoustic wave (SAW) device, comprising:

a piezoelectric substrate having a leaky wave mode;

a conductive pattern disposed on the piezoelectric substrate, the conductive pattern defining a geometry for the surface acoustic wave device; and an overlay material disposed on the conductive pattern, and having a thickness selected to control attenuation of the SAW device when operating at a particular frequency.

19. The surface acoustic wave device of claim 18, wherein conductive pattern has a shorted surface portion and the piezoelectric substrate has a substrate orientation selected to control attenuation from the shorted surface portion.

20. The surface acoustic wave device of claim 18, wherein conductive pattern has a free surface portion and the thickness of the overlay material is selected to control attenuation from the free surface portion.

21. The surface acoustic wave device of claim 20, wherein the thickness, H, of the overlay material, in meters, is related to the particular frequency, F, in hertz, such that H times F ranges from 50 to 1500.

22. A surface acoustic wave (SAW) device having an operating frequency, comprising:

a lithium niobate substrate having a particular Y-cut angle;

a conductive pattern disposed on the lithium niobate substrate, the conductive pattern defining a geometry for the surface acoustic wave device; and a glass material disposed on the conductive pattern, and having a thickness within thirty percent of a value, H, wherein:

$$H = 1/f_0(a_{00} + a_{11}p + a_{12}p^2 + a_{21}c_{11}^2 + a_{22}c_{11}^2 + a_{31}c_{44} + a_{32}c_{44} + a_{41}\beta + a_{42}\beta^2)$$

where,

H is the glass thickness in meters;

$f_0$ is the operating frequency in hertz;

$\rho$ is the mass density of the glass in kg/m$^3$;

$c_{11}$, $c_{44}$ are stiffness tensor elements for the glass material divided by $10^{10}$ newton-meters;

$\beta$ is the particular Y-cut angle in degrees;

$\alpha_{00}$ is 382.983, $\alpha_{11}$ is −1.09387, $\alpha_{12}$ is 0.143273E-03, $\alpha_{21}$ is 89.1932, $\alpha_{22}$ is −7.75504, $\alpha_{31}$ is 386.210, $\alpha_{32}$ is −12.5911, $\alpha_{41}$ is −2.90886, $\alpha_{42}$ is 0.164125.

23. A method for forming surface acoustic wave (SAW) device having a particular operating frequency, comprising the steps of:

forming a SAW pattern on a piezoelectric substrate having a leaky wave mode; and overlaying the SAW pattern with a glass layer having a thickness selected to reduce attenuation for a surface acoustic wave corresponding to the particular operating frequency.

24. The method of claim 23, wherein the step of overlaying comprises the step of selecting the thickness of the glass layer to minimize attenuation from a free surface portion of the SAW pattern.

25. The method of claim 24, wherein the step of forming comprises the step of selecting a piezoelectric substrate of lithium niobate having a Y-cut angle of 57 degrees.

* * * * *